Nov. 27, 1962 R. L. MILLER 3,066,248

SEMICONDUCTOR DEVICE

Filed Dec. 16, 1958

INVENTOR.
RALPH L. MILLER
BY
Mason, Kolehmainen, Rathburn & Wyss
ATTYS.

United States Patent Office 3,066,248
Patented Nov. 27, 1962

3,066,248
SEMICONDUCTOR DEVICE

Ralph L. Miller, Omaha, Nebr., assignor to Sarkes Tarzian, Inc., Bloomington, Ind., a corporation of Indiana
Filed Dec. 16, 1958, Ser. No. 780,747
3 Claims. (Cl. 317—234)

The present invention relates to semiconductor devices and more particularly to a new and improved semiconductor diode and a method of constructing it.

Many semiconductor devices such, for example, as PN junction silicon rectifiers tend to deteriorate with time by virtue of the reduction in the back resistance across the PN junction thereof. Where the junction is formed by an alloying process and a soft dot is provided on the impurity side of the junction, this loss of back resistance is believed to be caused by two factors. One of these factors is the absorption of moisture from the air or from other components in the completed device by the semiconductor material along the surface of the junction. The other factor seems to be that the continuous pressure which is exerted on the soft dot in the assembled diode causes the dot to gradually flow or creep across the junction to which it is adjacent, thereby to gradually reduce the resistance of the junction and eventually short-circuit it.

Therefore, an object of the present invention is to provide a new and improved method of making semiconductor devices.

Another object of the present invention is to provide a new and improved semiconductor device.

Another object of the present invention is to provide a method of making a semiconductor diode which includes a soft dot on one side thereof.

Another object of the present invention is to provide a semiconductor device including means for preventing deterioration of a semiconductor junction therein.

Briefly, the above and further objects are realized in accordance with the present invention by providing a semi-conductor diode in which an alloyed junction therein is formed by applying to one side of a semiconductor crystal a metallic dot including a controlled amount of a suitable impurity and a sufficient amount of an additional material for rendering the dot relatively soft so as to prevent cracking of the crystal when the dot solidifies during the alloying process. After the junction is completed, the device is heated to a temperature exceeding the temperatures encountered during normal use of the diode but less than the melting point of the dot, and the soft metal dot, which is disposed on one side of the junction, is encapsulated with an insulating material which when solidified is both rigid and moisture-tight. Consequently, cold flow of the dot material across the junction is prevented and the junction is sealed from the atmosphere to prevent penetration therein of the moisture from the surroundings.

The invention, both as to its organization and method of operation, together with further objects and advantages thereof, will best be understood by reference to the following description taken in connection with the accompanying drawing, in which.

Figure 1:
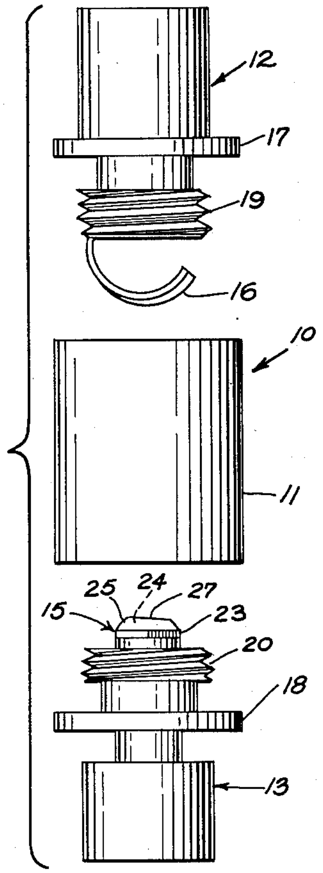
FIG. 1 is an exploded plan view of a semiconductor diode embodying the present invention.
Figures 2, 3:
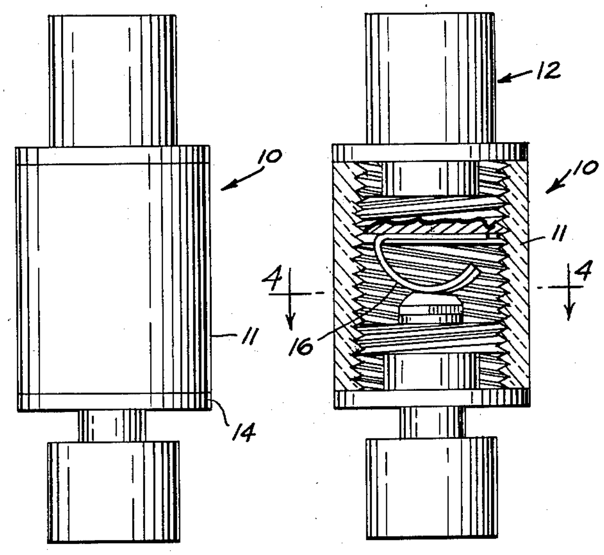
FIG. 2 is a plan view of an assembled diode.
FIG. 3 is a plan view, partially in section, of the diode of FIG. 2.
Figure 4:
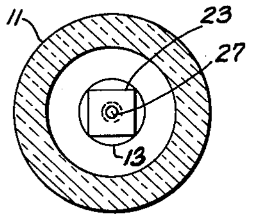
FIG. 4 is a cross sectional view taken along the line 4—4 in FIG. 3.

Referring now to the drawings and particularly to FIGS. 1, 2 and 3 thereof, there is shown a semiconductor diode 10 which includes an insulating sleeve or housing 11, a set of conductive terminal members 12 and 13, and a semiconductor unit 15 having a PN junction between the upper and lower sides thereof. The semiconductor unit 15 is mounted on the upper or inner end of the terminal 13 and a resilient conductor or spring 16 is mounted on the lower or inner end of the terminal 12. Accordingly, when the terminals 12 and 13 are inserted into the respective ends of the sleeve 11, the semiconductor unit 15 is sandwiched between the terminals 12 and 13, and since the PN junction in unit 15 is disposed between the upper and lower sides thereof which connect to the respective terminals 12 and 13, a unidirectional impedance is provided between the terminals 12 and 13.

Considering the diode 10 in greater detail, the terminals 12 and 13 respectively include annular flanges 17 and 18 and threaded portions 19 and 20 so that after the spring 16 has been assembled to the terminal 12 and the semiconductor unit 15 has been mounted on the terminal 13, the diode 10 may be completed by screwing the terminals 12 and 13 into the sleeve 11 until the flanges 17 and 18 are brought up tight against the associated ends of the sleeve 11.

Preferably, the semiconductor unit 15 is formed in accordance with the method taught in copending application Serial No. 570,577, filed March 9, 1956, in the names of George Eannarino and George B. Finn, and assigned to the same assignee as the present invention, and now Patent No. 2,930,948. When the PN junction is formed in the semiconductor unit 15 in this manner, the semiconductor unit 15 comprises a thin semiconductor crystal dice 23 having a soft metallic dot 24 on the upper surface thereof, the lower surface of the crystal dice 23 being bonded to the end of the terminal 13. The dot 24 is a metallic alloy including aluminum and a substantial amount of tin and is, therefore, quite soft. Since the PN junction which is formed in the semiconductor unit 15 extends about the periphery of the dot 24, the compressive force which is exerted on the dot 24 between the spring 16 and the terminal 13 in the completed diode 10 may result in a cold flow of the dot 24 across the upper face of the crystal dice 23 thereby to short-circuit the PN junction and thus destroy the rectifying characteristics of the diode 10. In order to prevent such a deformation of the dot 24, a rigid insulating material 25 partially encloses the dot 24 and the adjoining face of the crystal 23, only the upper end 27 of the dot 24 being exposed for electrical connection to the spring 16. The insulating material 25 in which the dot 24 is thus encapsulated performs two functions; one, it prevents deformation of the dot 24; and two, it seals the semiconductor junction from the remainder of the diode to prevent contamination of the semiconductor material in the vicinity of the junction.

Figure 5:
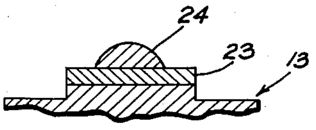
FIGS. 5, 6 and 7 are fragmentary cross sectional views of the diode of FIGS. 1, 2 and 3 illustrating certain steps carried out in constructing the diode in accordance with the present invention.
Figure 6:
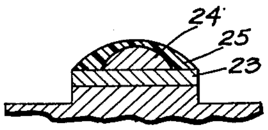
Figure 7:
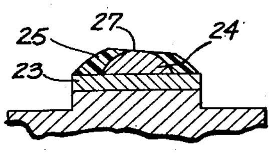

Referring now to FIGS. 5, 6 and 7, for a better understanding of the invention, the rigid insulating material 25 which partially encloses the dot 24 is preferably a thermosetting resin which can be applied in liquid or plastic form to the dot 24 and the adjoining face of the crystal 23 and thereafter cured or caused to set to a rigid insulation by application of heat or by treatment with a curing agent or activator. Among the curable resins which may be used for this purpose are polyester and epoxy resins which may be cured respectively with peroxides and organic amines. These resins after treatment with the curing agent or activator change into a substantially infusible and insoluble organic resin which is electrically insulating. Other thermosetting resins may also be used for the same purpose, including phenol-formaldehyde and melamine-formaldehyde resins which on application of heat are cured to a thermosetting, substantially infusible and insoluble product which serves as the insulating material 25.

As an example of the application of the rigid insulating material 25 to the dot 24, the following will illustrate a commercial operation. The diode comprising the crystal 23 and dot 24 is etched with a strong alkaline solution or with aqueous alkali and nitric acid and then rinsed thoroughly to remove water soluble materials. The unit is then dried at a temperature of 140 to 160° C. for about one hour. A silicone varnish is applied to the face of the crystal 23 and the dot 24 (preferred is a silicone varnish containing 10% polysiloxane in a varnish base known as Dow-Corning 997). The diode unit is then heated to 115 to 125° C. and a small amount of resin sufficient to cover the dot and the surface of the crystal 23 is applied. Preferred is a polyester resin, such as Vibrin 114 of Naugatuck Chemical Division of United States Rubber Company, which is activated by the addition of 1% by weight of a 50% solution of benzoyl peroxide in tricresyl phosphate (Luperco ATC of the Lucidol Division of Wallace and Tiernan, Inc.). The diode unit is placed in a curing oven at a temperature in the range of 100 to 120° C. and left for a period of time sufficient to insure complete curing of the resin. Actual curing occurs almost completely in about 30 minutes but to insure complete stability the unit may be left for 12 to 24 hours in the oven. After the resin has been cured the unit is removed from the oven and sanded or otherwise abraded to expose the dot 24 as illustrated in FIG. 7.

The same general procedure can be used in applying other thermosetting resins, such as epoxy resins, phenol-formaldehyde resins, melamine-formaldehyde resins and the like. When an epoxy resin is used, a curing agent or activator, such as diethylenetriamine or triethylenetetramine is intermixed with the epoxy resin prior to application to the crystal 23 and the dot 24. Heating is advantageous although not necessary for the curing of the polyester or epoxy resins. In commercial practice it is desirable to place the diode when treated with the resin in a curing oven at 100 to 125° F. in order to accelerate the curing of the resin and to prevent moisture absorption during the curing process.

It is desirable that the resin 25 shall have a thermo coefficient of expansion as close as possible to that of the diode components 23 and 24. For this purpose the polyester resin is particularly suitable, although as indicated above, other thermosetting resins can be selected with appropriate properties. All of the thermosetting resins discussed herein cure or set to an imperforate rigid insulating material which seals the diode unit from atmospheric moisture and prevents flow of the soft metallic dot 24 across the junction, thereby eliminating deterioration of the semiconductor junction.

While paraffin and like materials which are thermoplastic have been used to form electrically insulating moisture-free and water-impenetrable seal, such materials have serious deficiencies which are overcome by the present invention. In the first place, paraffin and other thermo-plastic materials are not rigid and water-impervious, particularly at elevated temperatures at which semiconductor diodes operate. On the contrary, such materials melt and flow away from the dot 24, thereby removing the electrically insulating and water protecting effect of the coating. Furthermore, such materials are too soft to resist cold flow or creep of the soft metal 24 and, therefore, cannot protect the semiconductor junction. In both respects the thermoplastic materials are unsuitable for insulation of the semiconductor junction.

While the present invention has been described in connection with a particular embodiment of the invention, it will be understood that various modifications may be made thereon which are within the true spirit and scope of the invention as defined in the appended claims.

What is claimed as new and is desired to be secured by Letters Patent of the United States is:

1. A diode comprising a first terminal, a second terminal, a semiconductor crystal mounted on said first terminal on one side of a PN junction in said crystal, a soft metal dot on the opposite side of said crystal, means for resiliently connecting said dot to said second terminal thereby to compress said crystal and said dot between said terminals, and a rigid insulating body of a thermoset resin partially enclosing said dot for preventing the deformation thereof by said compression, said rigid insulating body having a top surface generally parallel to the adjacent surface of said crystal so as to permit said resilient connecting means directly to engage the top surface of said dot.

2. A diode as set forth in claim 1 wherein said insulating means is imperforate and also encloses the surface of said crystal at which said junction is exposed.

3. A diode as set forth in claim 1 wherein said thermoset resin is a cured polyester resin.

References Cited in the file of this patent

UNITED STATES PATENTS

| | | |
|---|---|---|
| 2,736,847 | Barnes | Feb. 28, 1956 |
| 2,759,133 | Mueller | Aug. 14, 1956 |
| 2,813,326 | Liebowitz | Nov. 19, 1957 |
| 2,836,878 | Shepard | June 3, 1958 |
| 2,862,160 | Ross | Nov. 25, 1958 |
| 2,866,140 | Jones et al. | Dec. 23, 1958 |
| 2,874,340 | Lehovec | Feb. 17, 1959 |
| 2,989,424 | Angello | June 20, 1961 |